(12) United States Patent
Tagami et al.

(10) Patent No.: US 9,887,118 B2
(45) Date of Patent: Feb. 6, 2018

(54) WAFER PROCESSING LAMINATE, TEMPORARY ADHESIVE MATERIAL FOR WAFER PROCESSING, AND METHOD FOR MANUFACTURING THIN WAFER

(71) Applicant: SHIN-ETSU CHEMICAL CO., LTD., Tokyo (JP)

(72) Inventors: Shohei Tagami, Annaka (JP); Michihiro Sugo, Takasaki (JP); Masahito Tanabe, Annaka (JP); Hideto Kato, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/848,096

(22) Filed: Sep. 8, 2015

(65) Prior Publication Data

US 2016/0093522 A1    Mar. 31, 2016

(30) Foreign Application Priority Data

Sep. 26, 2014   (JP) ................................. 2014-197565

(51) Int. Cl.
*H01L 21/30* (2006.01)
*H01L 21/683* (2006.01)
(Continued)

(52) U.S. Cl.
CPC ............ *H01L 21/6835* (2013.01); *B32B 7/06* (2013.01); *B32B 7/12* (2013.01); *C09J 183/04* (2013.01);
(Continued)

(58) Field of Classification Search
CPC ............. H01L 21/6835; H01L 21/6836; H01L 21/68386; H01L 21/68318;
(Continued)

(56) References Cited

U.S. PATENT DOCUMENTS 7,541,264 B2   6/2009  Gardner et al.
2005/0233547 A1  10/2005  Noda et al.
(Continued)

FOREIGN PATENT DOCUMENTS

EP   2587530 A2   5/2013
EP   2722171 A1   4/2014
(Continued)

OTHER PUBLICATIONS

Feb. 2, 2016 Extended Search Report issued in European Patent Application No. 15002674.8.

*Primary Examiner* — Syed Gheyas
(74) *Attorney, Agent, or Firm* — Oliff PLC

(57) ABSTRACT

A wafer processing laminate including a support, a temporary adhesive material layer formed on the support, and a wafer laminated on the temporary adhesive material layer, the wafer having a circuit-forming front surface and back surface to be processed, wherein the temporary adhesive material layer includes a complex temporary adhesive material layer having two-layered structure including a first temporary adhesive layer composed of a thermoplastic organopolysiloxane polymer layer (A) having a film thickness of less than 100 nm and a second temporary adhesive layer composed of a thermosetting siloxane-modified polymer layer (B), the first temporary adhesive layer being releasably laminated to the front surface of the wafer, the second temporary adhesive layer being releasably laminated to the first temporary adhesive layer and the support. A temporary adhesive material for a wafer processing which withstand a thermal process at high temperature exceeding 300° C., facilitating temporary adhesion and delamination.

20 Claims, 1 Drawing Sheet

(51) Int. Cl.
*B32B 7/12* (2006.01)
*C09J 183/04* (2006.01)
*C09J 183/14* (2006.01)
*B32B 7/06* (2006.01)
*C09J 183/06* (2006.01)
C08G 77/00 (2006.01)
C08G 77/52 (2006.01)
C08G 77/50 (2006.01)

(52) U.S. Cl.
CPC .......... *C09J 183/06* (2013.01); *C09J 183/14* (2013.01); *B32B 2405/00* (2013.01); *B32B 2457/14* (2013.01); *C08G 77/50* (2013.01); *C08G 77/52* (2013.01); *C08G 77/70* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01)

(58) Field of Classification Search
CPC . H01L 21/68327; B32B 7/06; B32B 2405/00; C08G 77/04; C08G 77/70; C08G 77/80; C08G 77/14
See application file for complete search history.

(56) References Cited

U.S. PATENT DOCUMENTS

2013/0029145 A1* 1/2013 Kato .................. C09J 183/04
428/354
2013/0302983 A1 11/2013 Tanabe et al.

FOREIGN PATENT DOCUMENTS

| JP | 2004-064040 A | 2/2004 |
| JP | 2006-328104 A | 12/2006 |
| JP | 2013-048215 A | 3/2013 |

* cited by examiner

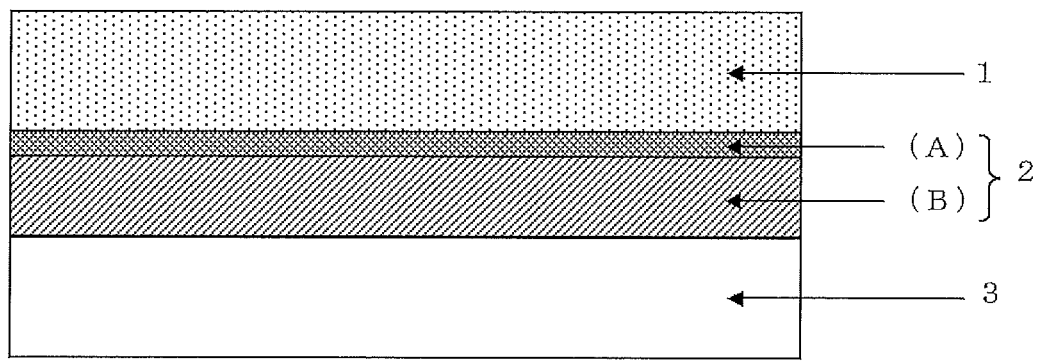

WAFER PROCESSING LAMINATE, TEMPORARY ADHESIVE MATERIAL FOR WAFER PROCESSING, AND METHOD FOR MANUFACTURING THIN WAFER

TECHNICAL FIELD

The present invention relates to a wafer processing laminate which can realize to obtain a thin wafer effectively, a temporary adhesive material for a wafer processing, and a method for manufacturing a thin wafer.

BACKGROUND ART

Three-dimensional semiconductor mounting has become essential for higher density and larger capacity. A three-dimensional mounting technique is a semiconductor production technique for thinning a semiconductor chip, and connecting the chip to another chip using a through silicon via (TSV) to form a multilayer. In order to realize this technique, steps of grinding a non-circuit-forming surface (also referred to as "back surface") of a substrate on which a semiconductor circuit has been formed to thin the substrate, and then forming an electrode including a TSV on the back surface, are required. Conventionally, in the step of grinding the back surface of a silicon substrate, a protective tape for the back surface is attached to a surface opposite to a surface to be ground for preventing breakage of the wafer during grinding. However, this tape uses an organic resin film as the base material, which has flexibility, but inadequate strength and heat resistance. Therefore, this tape is not suited to the steps of forming a TSV and forming a wiring layer on the back surface.

For this reason, a system has been proposed in which a semiconductor substrate is bonded to a support made of silicon, glass, or the like, through an adhesive layer to sufficiently withstand the steps of grinding a back surface and forming a TSV and an electrode on the back surface. In this system, the adhesive layer used for bonding the substrate to the support is important. The adhesive layer requires sufficient durability to bond the substrate to the support without gaps and to withstand subsequent steps. Further, it is necessary that a thin wafer can be easily delaminated from the support finally. Hence, the adhesive layer is finally delaminated, it is referred herein to as "temporary adhesive layer" (or, temporary adhesive material layer).

As to the conventionally known temporary adhesive layers and a method for delaminating the same, there have been proposed a technique in which high intensity light is irradiated to an adhesive material containing a light-absorbing substance to decompose the adhesive material layer whereby the adhesive material layer is delaminated from the support (Patent Literature 1), and a technique in which a heat fusible hydrocarbon compound is used for an adhesive material, and bonding and delamination are carried out in a heat-molten state (Patent Literature 2). The former technique has involved the problems that it requires an expensive tool such as laser, and a treatment time per one substrate is longer. The latter technique is simple because of control only by heat, but the applicable range is limited since thermal stability at high temperatures exceeding 200° C. is insufficient. Further, these temporary adhesive layers are not adequate to form a film with uniform thickness on a heavily stepped substrate and to provide a complete adhesion to the support.

Besides, it has been proposed to use a silicone adhesive agent for the temporary adhesive material layer (Patent Literature 3). This is to bond a substrate to a support by using an addition curable type silicone adhesive agent, and on delamination, the assembly is immersed in a chemical solution capable of dissolving or decomposing the silicone resin, whereby the substrate is separated from the support. Thus, this method takes a very long time for delamination and is difficultly applicable to the actual manufacturing process.

In view of the above-mentioned problems, there has been proposed a technique which uses a thermoplastic organopolysiloxane temporary adhesive layer and a thermosetting modified siloxane polymer temporary adhesive layer (Patent Literature 4). In this method, a temporary adhesive layer having some thermal process resistance can be formed with uniform film thickness on a heavily stepped substrate, and therefore it is highly compatible with steps of forming a TSV and forming a wiring on the back surface of the wafer, and delamination can be readily carried out. However, there is a problem of heat resistance at a high temperature exceeding 300° C.

CITATION LIST

Patent Literature

PATENT LITERATURE 1: Japanese Patent Laid-Open Publication No. 2004-64040
PATENT LITERATURE 2: Japanese Patent Laid-Open Publication No. 2006-328104
PATENT LITERATURE 3: U.S. Pat. No. 7,541,264
PATENT LITERATURE 4: Japanese Patent Laid-Open Publication No. 2013-48215

SUMMARY OF THE INVENTION

Technical Problem

The present invention was accomplished in view of the above-described problems, and has an object to provide a wafer processing laminate, a temporary adhesive material for a wafer processing, and a method for manufacturing a thin wafer using the same, which facilitates temporary adhesion, allows to form a layer with uniform film thickness on a heavily stepped substrate, is highly compatible with steps of forming a TSV and forming a wiring on the back surface of the wafer, has excellent resistance to a thermal process for wafer such as CVD (chemical vapor deposition), especially has resistance to a thermal process at high temperature exceeding 300° C. such as laser annealing treatment, and is capable of increasing productivity of thin wafers.

Solution to Problem

To accomplish the objects, the present invention provides a wafer processing laminate comprising a support, a temporary adhesive material layer formed on the support, and a wafer laminated on the temporary adhesive material layer, the wafer having a circuit-forming front surface and a back surface to be processed, wherein the temporary adhesive material layer comprises a complex temporary adhesive material layer having a two-layered structure that includes a first temporary adhesive layer composed of a thermoplastic organopolysiloxane polymer layer (A) having a film thickness of less than 100 nm and a second temporary adhesive layer composed of a thermosetting siloxane-modified polymer layer (B), the first temporary adhesive layer being releasably laminated to the front surface of the wafer, the second temporary adhesive layer being releasably laminated to the first temporary adhesive layer and the support.

Such a wafer processing laminate can be formed with uniform film thickness on a heavily stepped substrate, is highly compatible with steps of forming a TSV and forming a wiring on the back surface of the wafer, and has excellent resistance to a thermal process. In particular, forming the thermoplastic organopolysiloxane polymer layer (A) with a film thickness of less than 100 nm allows excellent resistance to a thermal process at a high temperature exceeding 300° C., specifically, up to a temperature of the temporary adhesive material layer of about 400° C. Thus, productivity of thin wafers can be increased.

Also, the present invention provides a temporary adhesive material for a wafer processing, the temporary adhesive material being used for temporarily bonding a wafer having a circuit-forming front surface and a back surface to be processed to a support, comprising a complex temporary adhesive material layer having a two-layered structure that includes a first temporary adhesive layer composed of a thermoplastic organopolysiloxane polymer layer (A) having a film thickness of less than 100 nm and a second temporary adhesive layer composed of a thermosetting siloxane-modified polymer layer (B), wherein the first temporary adhesive layer is capable of being releasably laminated to the front surface of the wafer, and the second temporary adhesive layer is releasably laminated to the first temporary adhesive layer and is capable of being releasably laminated to the support.

Such a temporary adhesive material for a wafer processing facilitates temporary adhesion between a wafer and a support, enables a film to be formed with uniform thickness on a heavily stepped substrate, is highly compatible with steps of forming a TSV and forming a wiring on the back surface of the wafer, and has excellent thermal process resistance. In particular, forming the thermoplastic organopolysiloxane polymer layer (A) with a film thickness of less than 100 nm allows excellent resistance to a thermal process even at a high temperature exceeding 300° C. Thus, productivity of thin wafers can be increased.

In these cases, the film thickness of the first temporary adhesive layer is less than 100 nm, preferably from 1 to 80 nm.

This film thickness allows further excellent resistance to a thermal process at a high temperature exceeding 300° C.

Also, in these cases, the thermoplastic organopolysiloxane polymer layer (A) is preferably an unreactive organopolysiloxane layer containing 99.000 to 99.999 mol % of a siloxane unit (D unit) represented by $R^{11}R^{12}SiO_{2/2}$, 1.000 to 0.001 mol % of a siloxane unit (M unit) represented by $R^{13}R^{14}R^{15}SiO_{1/2}$, and 0.000 to 0.500 mol % of a siloxane unit (T unit) represented by $R^{16}SiO_{3/2}$, where $R^{11}$, $R^{12}$, $R^{13}$, $R^{14}$, $R^{15}$, and $R^{16}$ each represent an unsubstituted or substituted monovalent hydrocarbon group, having a weight average molecular weight of 200,000 to 1,000,000, and containing 0.5% by mass or less of a low molecular weight component having a molecular weight of 740 or less.

Such a thermoplastic organopolysiloxane polymer layer (A) is preferred since it is excellent in adhesiveness and heat resistance.

Also, in these cases, the thermosetting siloxane-modified polymer layer (B) is preferably a layer of a composition containing 100 parts by mass of a siloxane bond-containing polymer having a repeating unit represented by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

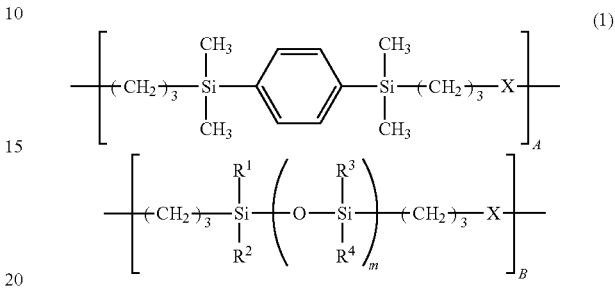

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (2),

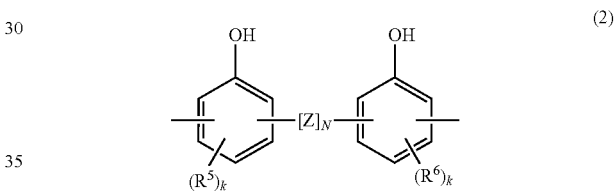

wherein Z represents a divalent organic group selected from any of

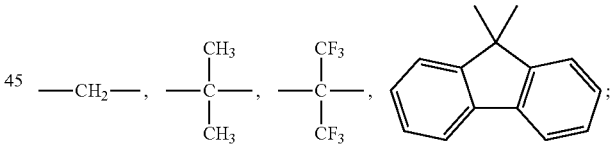

N represents 0 or 1; $R^5$ and $R^6$ each represent an alkyl or alkoxy group having 1 to 4 carbon atoms, and may be the same or different from each other; and "k" represents any of 0, 1, and 2.

Such a thermosetting siloxane-modified polymer layer (B) is preferred since the product becomes further excellent in heat resistance.

Also, in these cases, the thermosetting siloxane-modified polymer layer (B) is preferably a layer of a composition containing 100 parts by mass of a siloxane bond-containing polymer having a repeating unit represented by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

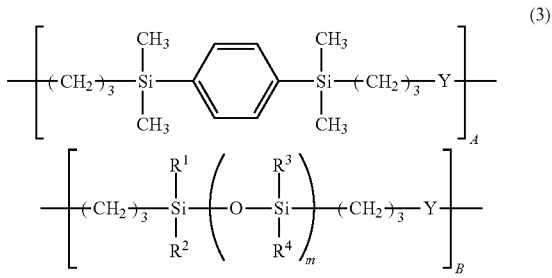

(3)

wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (4),

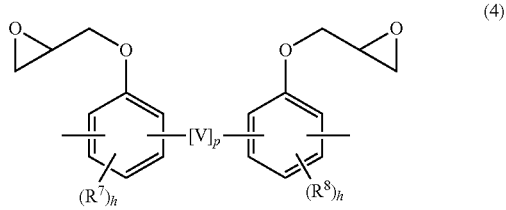

(4)

wherein V represents a divalent organic group selected from any of

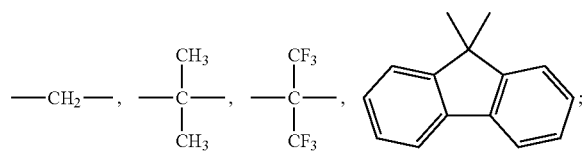

"p" represents 0 or 1; $R^7$ and $R^8$ each represent an alkyl or alkoxy group having 1 to 4 carbon atoms, and may be the same or different from each other; and "h" represents any of 0, 1, and 2.

Such a thermosetting siloxane-modified polymer layer (B) is preferred since the product becomes further excellent in heat resistance.

Further, in these cases, it is preferred that in a state that the thermosetting siloxane-modified polymer layer (B) is laminated to the thermoplastic organopolysiloxane polymer layer (A), the polymer layer (A) exhibits 1 to 50 gf of a peeing force when the polymer layer (B) is peeled from the polymer layer (A) after heat curing, wherein the peeling force is measured by 180° peeling using a test piece having a width of 25 mm.

When the thermoplastic organopolysiloxane polymer layer (A) has the peeling force as mentioned above, there is no fear of causing slippage of the wafer at the time of grinding the wafer, and delamination can be readily performed, therefore it is preferred.

Further, the present invention also provides a method for manufacturing a thin wafer comprising the steps of:
(a) bonding a support to a circuit-forming front surface of a wafer that has the circuit-forming front surface and a non-circuit-forming back surface through a complex temporary adhesive material layer used for the wafer processing laminate of the present invention, the complex temporary adhesive material layer including the thermoplastic organopolysiloxane polymer layer (A) and the thermosetting siloxane-modified polymer layer (B), wherein the bonding is performed by bonding the support formed with the thermosetting siloxane-modified polymer layer (B) to the circuit-attached wafer formed with the polymer layer (A) under vacuum;
(b) heat curing the polymer layer (B);
(c) grinding or polishing the non-circuit-forming back surface of the wafer bonded to the support;
(d) processing the non-circuit-forming back surface of the wafer; and
(e) delaminating the support and the thermosetting siloxane-modified polymer layer (B) laminated to the support together from the processed wafer.

According to such a method for manufacturing a thin wafer, a temporary adhesive material layer including two layers of the present invention is used to bond a wafer to a support. Thus, by using the temporary adhesive material layer, a thin wafer having a through electrode structure or a bump connection structure can be easily manufactured. In addition, the delaminating step as mentioned above facilitates delamination of the support from the processed wafer. Furthermore, the support formed with the polymer layer (B) is bonded under vacuum to the circuit-attached wafer formed with the polymer layer (A), whereby the polymer layer (B) can be formed by spin coating, and bonding can be performed regardless of the front surface state of the circuit-attached wafer.

Further, the present invention also provides a method for manufacturing a thin wafer comprising the steps of:
(a) bonding a support to a circuit-forming front surface of a wafer that has the circuit-forming front surface and a non-circuit-forming back surface through a complex temporary adhesive material layer used for the wafer processing laminate of the present invention, the complex temporary adhesive material layer including the thermoplastic organopolysiloxane polymer layer (A) and the thermosetting siloxane-modified polymer layer (B), wherein the bonding is performed by bonding the support to the circuit-attached wafer having the thermoplastic organopolysiloxane polymer layer (A) formed on the circuit-forming front surface and the thermosetting siloxane-modified polymer layer (B) formed on the polymer layer (A) under vacuum;
(b) heat curing the polymer layer (B);
(c) grinding or polishing the non-circuit-forming back surface of the wafer bonded to the support;
(d) processing the non-circuit-forming back surface of the wafer; and
(e) delaminating the support and the thermosetting siloxane-modified polymer layer (B) laminated to the support together from the processed wafer.

According to such a method for manufacturing a thin wafer, a temporary adhesive material layer including two layers of the present invention is used to bond a wafer to a support. Thus, a thin wafer having a through electrode structure or a bump connection structure can be easily manufactured by using the temporary adhesive material layer. In addition, the delaminating step as mentioned above facilitates delamination of the support from the processed wafer. Furthermore, the support is bonded under vacuum to the circuit-attached wafer having the polymer layer (A) and the polymer layer (B) formed thereon, whereby the polymer layer (B) is formed by spin coating without a residue of the polymer layer (B) on a side surface of the support, and therefore, there is no fear of peeling off the residue in subsequent processes.

Advantageous Effects of Invention

The temporary adhesive material layer of the present invention has two-layered structure, and in particular, a thermosetting siloxane-modified resin (polymer layer (B)) is used as a supporting layer for bonding the substrate, whereby thermal decomposition of the resin does not occur as a matter of course, and flow of the resin at high temperature does not occur. Accordingly, it can be applied to a wide range of the semiconductor film-forming process because of high heat resistance, and an adhesive material layer with a highly uniform thickness can be formed even on a stepped wafer. By virtue of the uniform thickness of the film, a uniform thin wafer of 50 μm or thinner can be readily manufactured. Further, forming the thermoplastic organopolysiloxane polymer resin (polymer layer (A)) with a film thickness of less than 100 nm allows excellent resistance to a thermal process at a high temperature exceeding 300° C., so that the process selectivity in the manufacture of thin wafers can be improved, and productivity thereof can be increased.

BRIEF DESCRIPTION OF DRAWINGS

FIG. 1 is a cross-sectional view of an exemplary wafer processing laminate of the present invention.

DESCRIPTION OF EMBODIMENTS

Hereinafter, the present invention will be described in detail.

As described above, it has been expected to develop a wafer processing laminate and a temporary adhesive material for a wafer processing which facilitates temporary adhesion, allows to form a layer with uniform film thickness on a heavily stepped substrate, is highly compatible with steps of forming a TSV and forming a wiring on the back surface of the wafer, has excellent resistance to a thermal process for wafer, especially has resistance to a thermal process at high temperature exceeding 300° C., and is capable of increasing productivity of thin wafers.

The present inventors earnestly studied to accomplish the above mentioned objects and consequently found a method for easily manufacturing a thin wafer having a through electrode structure or a bump interconnect structure by using a temporary adhesive material layer that has two-layer system including
(A) a thermoplastic temporary adhesive layer composed of a thermoplastic organopolysiloxane polymer layer with a film thickness of less than 100 nm and
(B) a thermosetting temporary adhesive layer composed of a thermosetting siloxane-modified polymer layer in which the layers are formed in the order of (A) and (B) from the wafer side to bond the wafer to the support.

FIG. 1 is a cross-sectional view of an exemplary wafer processing laminate of the present invention. As shown in FIG. 1, the wafer processing laminate of the present invention has a wafer 1 having a circuit-forming front surface and a back surface to be processed, a support 3 for supporting the wafer 1 at the time of processing the wafer 1, and a temporary adhesive material layer 2 for intervening between the wafer 1 and the support 3. The temporary adhesive material layer 2 is composed of a two-layered structure including a thermoplastic organopolysiloxane polymer layer (A) (first temporary adhesive layer) having a film thickness of less than 100 nm and a thermosetting siloxane-modified polymer layer (B) (second temporary adhesive layer). The first temporary adhesive layer is releasably laminated to the front surface of the wafer 1, and the second temporary adhesive layer is laminated to the support 3.

Also, the temporary adhesive material for a wafer processing of the present invention includes a laminated material of the polymer layers (A) and (B) mentioned above, in which the respective layers are releasably laminated.

Hereinafter, the present invention will be described in more detail, but the present invention is not limited thereto.
[Temporary Adhesive Material Layer]
—First Temporary Adhesive Layer (A)/Thermoplastic Organopolysiloxane Polymer Layer—

The first temporary adhesive layer is composed of a thermoplastic organopolysiloxane polymer. The thermoplastic organopolysiloxane polymer may be, for example, an unreactive organopolysiloxane containing 99.000 to 99.999 mol %, preferably 99.500 to 99.999 mol % of a siloxane unit (D unit) represented by $R^{11}R^{12}SiO_{2/2}$, 1.000 to 0.001 mol %, preferably 0.500 to 0.001 mol % of a siloxane unit (M unit) represented by $R^{13}R^{14}R^{15}SiO_{1/2}$, and 0.000 to 0.500 mol %, preferably 0.000 to 0.100 mol % of a siloxane unit (T unit) represented by $R^{16}SiO_{3/2}$, having a weight average molecular weight of 200,000 to 1,000,000, preferably 400,000 to 900,000, and containing 0.5% by mass or less of a low molecular weight component having a molecular weight of 740 or less.

In the above formulae, the organic substituents $R^{11}$, $R^{12}$, $R^{13}$, $R^{14}$, $R^{15}$, and $R^{16}$ each represent an unsubstituted or substituted monovalent hydrocarbon group, preferably an unsubstituted or substituted monovalent hydrocarbon group having 1 to 10 carbon atoms. Illustrative examples thereof include hydrocarbon groups, e.g., alkyl groups such as a methyl group, an ethyl group, an n-propyl group, an isopropyl group, an n-butyl group, a tert-butyl group, an n-pentyl group, a cyclopentyl group, and an n-hexyl group, cycloalkyl groups such as a cyclohexyl group, aryl groups such as a phenyl group and a tolyl group; and groups in which a part or whole of the hydrogen atoms of the above groups is/are substituted by a halogen atom(s); and a methyl group and a phenyl group are preferred.

The molecular weight of the above-mentioned organopolysiloxane is a value of a weight average molecular weight obtained in accordance with a calibration curve prepared by using polystyrene standard substances by GPC (gel permeation chromatography) (herein, "weight average molecular weight" means this value.), and the weight average molecular weight is 200,000 or more, more preferably 350,000 or more, and 1,000,000 or less, more preferably 800,000 or less. Further, the content of a low molecular weight component having a molecular weight of 740 or less is 0.5% by mass or less, more preferably 0.1% by mass or less.

In the organopolysiloxane, if the weight average molecular weight is 200,000 or more, it is preferred since it can sufficiently withstand the grinding step for thinning the wafer. If the weight average molecular weight is 1,000,000 or less, it is preferred since it can be cleaned at a cleaning step after completion of the steps. On the other hand, if the content of the low molecular weight component having a molecular weight of 740 or less is 0.5% by mass or less, it is preferred since sufficient heat resistance can be obtained to withstand the heat treatment during formation of a through electrode or the heat treatment of bump electrodes formed on the wafer back surface.

Further, D unit preferably constitutes 99.000 to 99.999 mol % of the resin. If the content is 99.000 mol % or more, it is preferred since the resin can withstand the grinding step for thinning the wafer; and if it is 99.999 mol % or less, delamination from the temporary adhesive layer (B) can be readily performed after completion of the steps.

M unit is added to cap the active group at the ends of the resin mainly consisting of D unit, and used for adjusting the molecular weight thereof.

The thermoplastic organopolysiloxane polymer layer may be formed on the wafer by applying a solution thereof by a method such as spin coating, roll coater, etc. When the layer (A) is formed on the wafer by the method of spin coating, etc., it is preferred to apply the resin in the form of solution. In this case, a hydrocarbon solvent such as pentane, hexane, cyclohexane, isononane, decane, isododecane, limonene, and p-menthane, is preferably used. Also, the film thickness of the layer (A) (first temporary adhesive layer) in the wafer processing laminate and the temporary adhesive material for a wafer processing of the present invention is less than 100 nm. the film thickness of the layer (A) is preferably from 1 to 80 nm, more preferably from 2 to 60 nm, much more preferably from 3 to 50 nm. If the film thickness of the layer (A) is from 1 to 80 nm, the wafer and the support can be readily delaminated from each other. If the film thickness of the layer (A) is 100 nm or more, it cannot withstand the high temperature process exceeding 300° C. As a result, appearance abnormalities such as voids, blister of the wafer, and breakage of the wafer occur in the laminated wafer.

—Second Temporary Adhesive Layer (B)/Thermosetting Siloxane-Modified Polymer Layer—

The thermosetting siloxane-modified polymer layer (B), which is the constitutional element of the wafer processing laminate and the temporary adhesive material for a wafer processing of the present invention, is not particularly limited so long as it is a thermosetting siloxane-modified polymer layer, but preferably is a layer of the thermosetting composition mainly consisting of the thermosetting siloxane-modified polymer represented by either of the following general formula (1) or (3). Meanwhile, the polymer layer (B) may be a combination of the polymers represented by the general formulae (1) and (3). In this case, the (polymerization) ratio of (1):(3) is preferably from 0.1:99.9 to 99.9:0.1, more preferably from 1:99 to 99:1.

Polymer of Formula (1) (Phenolic Siloxane Polymer):

A polymer of the general formula (1) is a siloxane bond-containing polymer (phenol group-containing organosiloxane bond-containing polymer compound). This polymer has a repeating unit represented by the general formula (1) and a weight average molecular weight of 3,000 to 500,000, preferably 10,000 to 100,000,

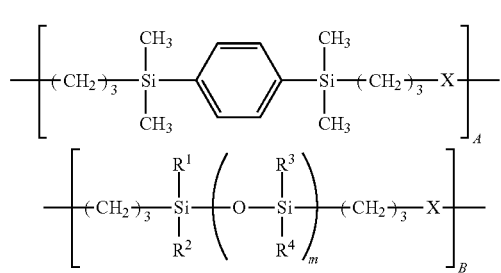

(1)

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (2),

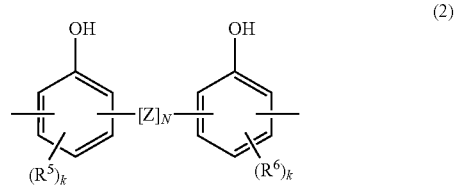

(2)

wherein Z represents a divalent organic group selected from any of

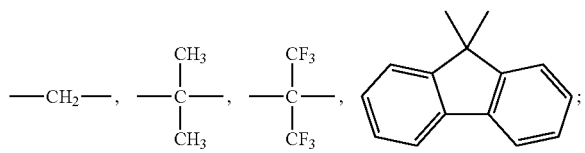

N represents 0 or 1; $R^5$ and $R^6$ each represent an alkyl or alkoxy group having 1 to 4 carbon atoms, and may be the same or different from each other; and "k" represents any of 0, 1, and 2.

In this case, illustrative examples of $R^1$ to $R^4$ include alkyl groups such as a methyl group and an ethyl group; and a phenyl group. "m" represents an integer of preferably 3 to 60, more preferably 8 to 40. Also, B/A is from 0 to 20, in particular from 0.5 to 5.

Polymer of Formula (3) (Epoxy-Modified Siloxane Polymer):

A polymer of the general formula (3) is a siloxane bond-containing polymer (epoxy group-containing silicone polymer compound). This polymer has a repeating unit represented by the general formula (3) and a weight average molecular weight of 3,000 to 500,000,

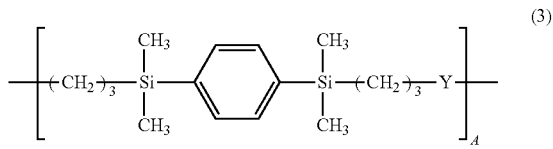

(3)

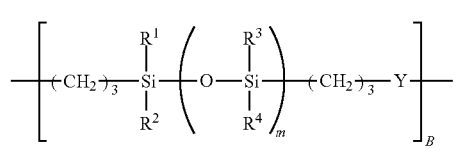

wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (4),

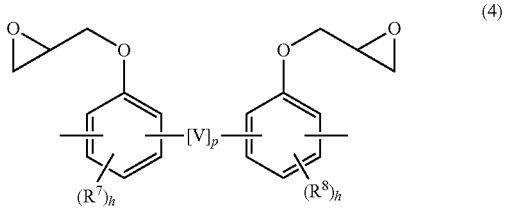

(4)

wherein V represents a divalent organic group selected from any of

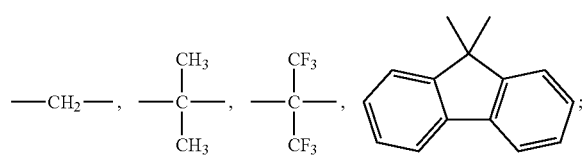

"p" represents 0 or 1; R⁷ and R⁸ each represent an alkyl or alkoxy group having 1 to 4 carbon atoms, and may be the same or different from each other; and "h" represents any of 0, 1, and 2.

In this case, illustrative examples of $R^1$ to $R^4$ and "m" are the same as in the above-mentioned formula (1).

The thermosetting composition mainly consisting of the thermosetting siloxane-modified polymer of the general formula (1) or (3) contains one or more crosslinkers for heat curing. In the case of the phenolic siloxane polymer of the general formula (1), the crosslinker is selected from an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule.

Here, an amino condensate, a melamine resin, a urea resin each modified with formalin or formalin-alcohol may be exemplified by the following. For example, an melamine resin (condensate) modified with formalin or formalin-alcohol can be obtained by addition condensation polymerization of a modified melamine monomer (e.g. trimethoxymethyl monomethylol melamine), or a polymer thereof (e.g. oligomer such as dimer and trimer) with formaldehyde until a desired molecular weight is achieved, according to a known method. These compounds may be used alone or in admixture of two or more.

Also, a urea resin (condensate) modified with formalin or formalin-alcohol can be prepared by modifying a urea condensate having a desired molecular weight with formalin into a methylol form, and optionally, further modifying the resultant compound with an alcohol into an alkoxy form, according to a known method. Illustrative examples of the urea resin modified with formalin or formalin-alcohol include methoxymethylated urea condensate, ethoxymethylated urea condensate, and propoxymethylated urea condensate. These compounds may be used alone or in admixture of two or more.

Illustrative examples of the phenol compound having on average two or more methylol or alkoxymethylol groups per molecule include (2-hydroxy-5-methyl)-1,3-benzenedimethanol and 2,2',6,6'-tetramethoxymethyl-bisphenol A. These phenol compounds may be used alone or in admixture of two or more.

On the other hand, in the case of the epoxy modified siloxane polymer of the general formula (3), the composition contains one or more crosslinkers selected from an epoxy compound having on average two or more epoxy groups per molecule and a phenol compound having on average two or more phenol groups per molecule.

Here, the epoxy compound having a polyfunctional epoxy group used in the polymers of the general formulae (1) and (3) is not particularly limited, and in particular, a bi-functional, a tri-functional, or a tetra-functional or more of the polyfunctional epoxy resins, for example, EOCN-1020, EOCN-102S, XD-1000, NC-2000-L, EPPN-201, GAN, and NC6000 all available from Nippon Kayaku Co., Ltd., or a crosslinker represented by the following formula may be contained.

EOCN-1020

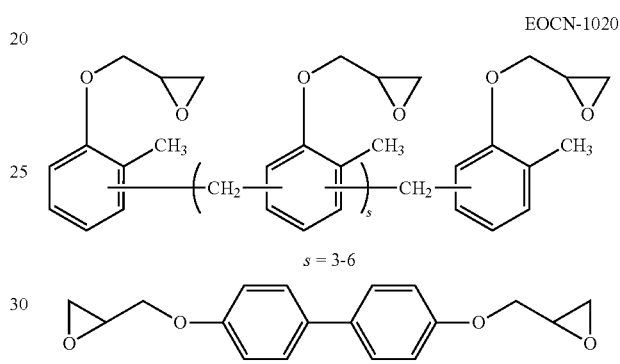

$s = 3-6$

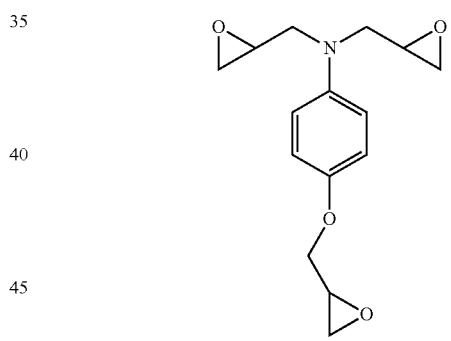

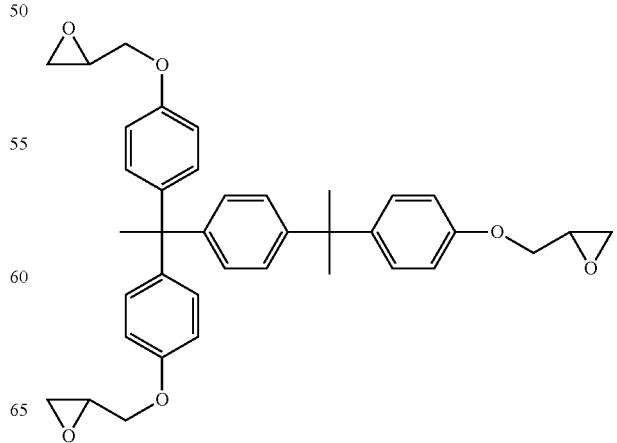

-continued

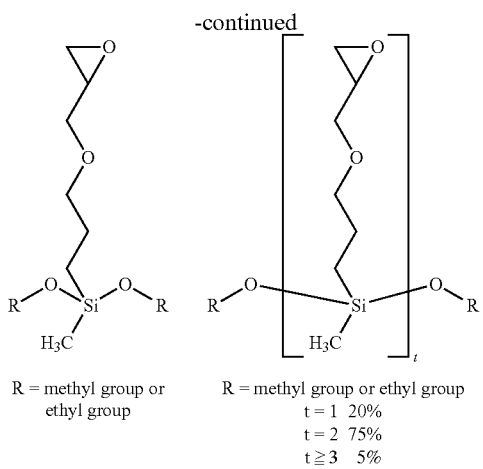

R = methyl group or ethyl group

R = methyl group or ethyl group
t = 1  20%
t = 2  75%
t ≥ 3  5%

When the thermosetting siloxane-modified polymer is the epoxy-modified siloxane polymer of the general formula (3), as the crosslinker thereof, there may be mentioned a m- or p-series cresol-novolac resin such as EP-6030G available from Asahi Organic Chemicals Industry Co., Ltd., tri-functional phenol compound such as Tris-P-PA4 available from Honshu Chemical Industry Co., Ltd., and tetra-functional phenol compound such as TEP-TPA available from Asahi Organic Chemicals Industry Co., Ltd., etc.

The formulation amount of the crosslinker is 0.1 to 50 parts by mass, preferably 0.1 to 30 parts by mass, more preferably 1 to 20 parts by mass based on 100 parts by mass of the thermosetting siloxane-modified polymer, and it may be formulated in admixture of two or more.

A curing catalyst such as an acid anhydride may be added in an amount of 10 parts by mass or less based on 100 parts by mass of the thermosetting siloxane-modified polymer.

Also, the composition containing the thermosetting siloxane-modified polymer, etc., may be dissolved in a solvent, and applied to the support specifically by a method such as spin coating, roll coater, and die coater, to form a layer. In such a case, illustrative examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, and γ-butyrolactone. These solvents may be used alone or in admixture of two or more.

Incidentally, a known antioxidant, a filler such as silica, may be added in an amount of 50 parts by mass or less based on 100 parts by mass of the thermosetting siloxane-modified polymer to further enhance heat resistance. Moreover, a surfactant may be added to improve coating uniformity.

Illustrative examples of the antioxidant that can be added into the polymer layer (B) include hindered phenol-based compounds such as tetrakis[methylene-(3,5-di-tert-butyl-4-hydroxyhydrocinnamate)]methane (trade name: Adekastab AO-60).

The thermosetting siloxane-modified polymer layer (B) in the wafer processing laminate and the temporary adhesive material for a wafer processing of the present invention preferably has a film thickness of 15 to 150 μm, more preferably 20 to 120 μm, depending on the steps at the wafer side. If the film thickness is 15 μm or more, it can sufficiently withstand the grinding step for thinning the wafer, while if it is 150 μm or less, there is no fear of generating resin deformation in the heat treatment step such as TSV formation step, and it can endure for practical use, so that it is preferred.

The thermoplastic organopolysiloxane polymer layer (A) generally exhibits 1 to 50 gf, preferably 3 to 30 gf, more preferably 5 to 20 gf of a peeing force when the thermosetting siloxane-modified polymer layer (B) laminated on the polymer layer (A) is peeled therefrom after heat curing, in which the peeling force is measured by 180° peeling using a test piece having a width of 25 mm. If it is 1 gf or more, there is no fear of causing slippage of the wafer at the time of grinding the wafer, and if it is 50 gf or less, delamination of the wafer can be readily performed, therefore it is preferred.

—Optional Component—

Into the temporary adhesive material for a wafer processing of the present invention, optional components may be added besides the respective components mentioned above. For example, unreactive organopolysiloxane such as polydimethyl siloxane and polydimethyldiphenyl siloxane; an antioxidant of phenol type, quinone type, amine type, phosphorus type, phosphite type, sulfur type, thioether type, or other type; a photo stabilizer of triazole type, benzophenone type, or other type; a flame retardant of phosphoric acid ester type, halogen type, phosphorus type, antimony type, or other type; an antistatic agent such as cationic activator, an anionic activator, and a nonionic activator; as a solvent for lowering the viscosity during coating, an aromatic solvent such as toluene and xylene; an aliphatic solvent such as hexane, octane, and isoparaffin; a ketone solvent such as methyl ethyl ketone and methyl isobutyl ketone; an ester solvent such as ethyl acetate and isobutyl acetate; an ether solvent such as diisopropyl ether and 1,4-dioxane; or a mixed solvent thereof may be used.

[Method for Manufacturing a Thin Wafer]

The method for manufacturing a thin wafer of the present invention is characterized by using the complex temporary adhesive material layer composed of two layers including the thermoplastic organopolysiloxane polymer layer (A) with a film thickness of less than 100 nm and the thermosetting siloxane-modified polymer layer (B) as the layer for bonding the support to the wafer having a semiconductor circuit, etc. The thickness of a thin wafer obtained by the manufacturing method of the present invention is typically 5 to 300 μm, more typically 10 to 100 μm.

The method for manufacturing a thin wafer of the present invention has the steps of (a) to (e). In addition, it also has the steps of (f) to (i), if necessary.

[Step (a)]

Step (a) is a step of bonding a support to a circuit-forming front surface of a wafer that has the circuit-forming front surface and a non-circuit-forming back surface through a complex temporary adhesive material layer used for the wafer processing laminate of the present invention, in which the complex temporary adhesive material layer includes the thermoplastic organopolysiloxane polymer layer (A) and the thermosetting siloxane-modified polymer layer (B). At this time, the bonding may be performed under vacuum by bonding the support having the polymer layer (B) formed thereon to the circuit-attached wafer having the polymer layer (A) formed thereon. Alternatively, the bonding may be performed under vacuum by bonding the support to the circuit-attached wafer having the thermoplastic organopolysiloxane polymer layer (A) formed on the circuit-forming front surface and the thermosetting siloxane-modified polymer layer (B) formed on the polymer layer (A).

The wafer that has a circuit-forming front surface and a non-circuit-forming back surface (i.e. circuit-attached wafer) is a wafer one of the surfaces of which is a circuit-forming surface, and the other surface of which is a non-circuit-forming surface. The wafer to which the present invention can be applied is generally a semiconductor wafer. Examples of the semiconductor wafer include not only a silicon wafer, but also a germanium wafer, a gallium-arsenic wafer, a gallium-phosphorus wafer, a gallium-arsenic-aluminum wafer, etc. The thickness of the wafer is not particularly limited, but typically 600 to 800 μm, more typically 625 to 775 μm.

As the support, a substrate such as a silicon wafer, a glass plate, and a quartz wafer can be used, but it is not particularly limited. In the present invention, it is not necessary to irradiate an energy beam to the temporary adhesive material layer through the support, so that the support does not require light transmittance.

The temporary adhesive layer (B) may be formed as films on the wafer or the support. Alternatively, the temporary adhesive layers (A) and (B) may be each formed by applying the respective solutions to the wafer or the support by a spin coating method or the like. In this case, after the spin coating, the layers are prebaked at 80 to 200° C. depending on the volatile conditions of the used solvent, and then used.

The wafer and the support on which the temporary adhesive layers (A) and (B) have been formed are formed as a substrate that is bonded via the layer (A) and the layer (B). At this time, this substrate is adhered by uniform compression under reduced pressure at a temperature ranging preferably from 40 to 200° C., more preferably from 60 to 180° C., thereby forming a wafer processing laminate (laminated substrate) in which the wafer are bonded to the support. As described above, the polymer layer (A) in this wafer processing laminate has a film thickness of less than 100 nm.

Examples of a wafer bonding apparatus include a commercially available wafer bonding apparatus, such as EVG520IS and 850 TB manufactured by EV Group, and XBC300 manufactured by SUSS MicroTec AG.

[Step (b)]
Step (b) is a step of heat curing the polymer layer (B). After forming the above-mentioned wafer processing laminate (laminated substrate), it is heated at 120 to 220° C., preferably 150 to 200° C., for 10 minutes to 4 hours, preferably 30 minutes to 2 hours, to cure the polymer layer (B).

[Step (c)]
Step (c) is a step of grinding or polishing the non-circuit-forming back surface of the wafer bonded to the support, in other words, a step of grinding or polishing the wafer processing laminate obtained by bonding in the step (a) from the wafer back surface side to reduce the thickness of the wafer. The technique for grinding the wafer back surface is not particularly limited, and conventionally known grinding techniques may be used. The grinding is preferably performed while feeding water to the wafer and a grinding wheel (e.g. diamond) for cooling. Examples of an apparatus for grinding the wafer back surface include DAG-810 (trade name) manufactured by DISCO Co., Ltd. Also, the wafer back surface side may be subjected to CMP polishing.

[Step (d)]
Step (d) is a step of processing the non-circuit-forming surface of the wafer processing laminate which has been ground, i.e., the non-circuit-forming surface of the wafer processing laminate which has been thinned by grinding the back surface. This step includes various processes applied in the wafer level. Examples thereof include wafer surface treatment, electrode formation, metal wiring formation, and protective film formation. More specifically, well-known processes may be mentioned, including CVD for wafer surface treatment, laser annealing, metal sputtering for forming electrodes and so on, vapor deposition, wet etching for etching a sputtered metal layer, patterning process in which a resist is applied and subjected to exposure and development to form a pattern used as a mask for metal wiring formation, resist removal, dry etching, formation of a metal plating, formation of an organic film for protecting the surface, silicon etching to form a TSV, and formation of an oxide film on silicon surface. These processes require that the processing laminate has a resistance ranging widely in a high temperature region up to about 400° C. In particular, the processing laminate preferably exhibits the strength and lifetime even at a temperature of 300° C. or higher.

[Step (e)]
Step (e) is a step of delaminating the support and the polymer layer (B) laminated to the support together from the wafer processed in the step (d), in other words, a step of delaminating the support and the polymer layer (B) together from the wafer processing lamenter after the thinned wafer is subjected to various processes. This delaminating step is generally carried out under relatively low temperature conditions from room temperature to about 60° C. Examples thereof include a method in which either of the wafer or the support of the wafer processing laminate is horizontally fixed, and the other is lifted at a certain angle with respect to the horizontal direction; and a method in which a protective film is adhered to the ground surface of the wafer, and then the wafer and the protective film are delaminated from the wafer processing laminate by peeling.

To the present invention, either of these delaminating methods can be applied, but it is not limited to these method. These delaminating methods are usually carried out at room temperature.

Also, the step (e) of delaminating the support and the polymer layer (B) together from the processed wafer preferably includes the steps of (f) adhering a dicing tape to the processed surface (back surface) of the processed wafer, (g) attaching a dicing tape surface by vacuum suction to a suction surface, and (h) delaminating the support from the processed wafer by peeling-off at a temperature of the suction surface in the range of 10 to 100° C. By employing these steps, the support can be easily delaminated from the processed wafer, and the subsequent dicing step can be easily carried out.

Also, after the step (e), a step (i) of removing the temporary adhesive material layer remaining on the circuit-forming front surface of the delaminated wafer is preferably carried out. There is a case where a part of the temporary adhesive layer (A) remains on the circuit-forming surface of the wafer that has been delaminated from the support by the step (e). In this case, the removal of the temporary adhesive layer (A) can be carried out, for example, by cleaning the wafer.

In the step (i), any cleaning solution can be used so long as the solution can dissolve the thermoplastic organopolysiloxane polymer layer constituting the layer (A) in the temporary adhesive material layer. Illustrative examples thereof include pentane, hexane, cyclohexane, decane, isononane, p-menthane, pinene, isododecane, and limonene. These solvents may be used alone, or in admixture of two or more kinds. If removal is difficult, a base or an acid may be added to the solvents. Examples of the usable base include amines such as ethanolamine, diethanolamine, triethanolamine, triethylamine, and ammonia; and ammonium salts such as tetramethylammonium hydroxide. Examples of the usable acid include organic acids such as acetic acid, oxalic acid, benzenesulfonic acid, and dodecylbenzenesulfonic acid. The amount thereof is 0.01 to 10% by mass, preferably 0.1 to 5% by mass in terms of a concentration in the cleaning solution. To improve removal efficiency of the residual matters, an existing surfactant may be added thereto. Cleaning may be performed by a paddle method using the above-mentioned solution, a spraying method, or a dipping method in a cleaner tank. The temperature in this operation is preferably 10 to 80° C., more preferably 15 to 65° C.; and if necessary, after dissolving the layer (A) in these dissolving solutions, it may be rinsed with water or an alcohol at the end of cleaning, and then dried to obtain a thin wafer.

EXAMPLES

In the following, the present invention will be specifically described with reference to Examples and Comparative Example, but the present invention is not limited to these Examples.

Resin Synthetic Example 1

In a four-necked flask were charged 1,000 g (3.38 mol) of octamethylcyclotetrasiloxane and 0.24 g (0.0015 mol) of hexamethyldisiloxane, and a temperature of the mixture was maintained at 110° C. Then, 4 g of 10% by mass tetrabutylphosphonium hydroxide siliconate was added to the mixture. After polymerization over 4 hours, a post-treatment was carried out at 160° C. for 2 hours to obtain dimethylpolysiloxane.

The obtained dimethylpolysiloxane was analyzed by $^{29}$Si-NMR method to determine the ratio of D unit and M unit. It was identified to be a dimethylpolysiloxane having the following structure containing 99.978% of D unit and 0.022% of M unit with a polymerization degree of about 9,000.

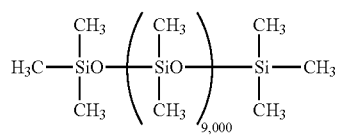

500 g of the dimethylpolysiloxane was dissolved in 500 g of hexane, the solution was then added to 2 L of acetone, and the precipitated resin was collected. Thereafter, hexane, etc., were removed under vacuum to obtain a dimethylpolysiloxane polymer (a1) having a weight average molecular weight of 700,000, and containing 0.05% by mass of a low molecular weight component having a molecular weight of 740 or less. 0.3 g of this polymer was dissolved in 100 g of isododecane, and the solution was filtered through 0.2 μm of a membrane filter to obtain an isododecane solution (A-1) of the dimethylpolysiloxane polymer. Incidentally, the weight average molecular weight was measured by GPC.

Resin Synthesis Example 2

In a four-necked flask were charged 1,000 g (3.38 mol) of octamethylcyclotetrasiloxane and 0.93 g (0.003 mol) of tris(trimethylsiloxy)methylsilane, and a temperature of the mixture was maintained at 110° C. Then, 4 g of 10% by mass tetrabutyl phosphonium hydroxide siliconate was added to the mixture. After polymerization over 4 hours, a post-treatment was carried out at 160° C. for 2 hours to obtain dimethylpolysiloxane.

The obtained dimethylpolysiloxane was analyzed by $^{29}$Si-NMR method to determine the ratio of D unit, M unit, and T unit. It was identified to be a branched dimethylpolysiloxane having the following structure containing 99.911% of D unit, 0.067% of M unit, and 0.022% of T unit.

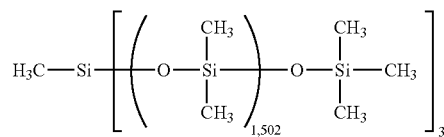

500 g of the branched dimethylpolysiloxane was dissolved in 500 g of hexane, the solution was then added to 2 L of acetone, and the precipitated resin was collected. Thereafter, hexane, etc., were removed under vacuum to obtain a dimethylpolysiloxane polymer (a2) having a weight average molecular weight of 400,000, and containing 0.07% by mass of a low molecular weight component having a molecular weight of 740 or less. 0.1 g of this polymer was dissolved in 100 g of isododecane, and the solution was filtered through 0.2 μm of a membrane filter to obtain an isododecane solution (A-2) of the dimethylpolysiloxane polymer.

Solution Preparation Example 1

1 g of the polymer (a2) obtained in Resin synthesis example 2 was dissolved in 99 g of isododecane, and the solution was filtered through 0.2 μm of a membrane filter to obtain an isododecane solution (A-3) of the dimethylpolysiloxane polymer.

Solution Preparation Example 2

2.5 g of the polymer (a2) obtained in Resin synthesis example 2 was dissolved in 97.5 g of isododecane, and the solution was filtered through 0.2 μm of a membrane filter to obtain an isododecane solution (A-4) of the dimethylpolysiloxane polymer.

Resin Synthesis Example 3

In a flask equipped with a stirrer, a thermometer, a nitrogen purge system, and a reflux condenser were placed 43.1 g of 9,9'-bis(3-allyl-4-hydroxyphenyl)fluorene (M-1), 29.5 g of organohydrogensiloxane having average structural formula (M-3), 135 g of toluene, and 0.04 g of chloroplatinic acid, and the resulting mixture was heated at 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 80 g of cyclohexanone was added thereto to obtain a resin solution containing cyclohexanone as a solvent with a concentration of the resin solid of 50% by mass. When the molecular weight of the resin in the solution was measured by GPC, the weight average molecular weight was 45,000 in terms of polystyrene. Further, to 50 g of the resin solution were added 7.5 g of epoxy crosslinker, EOCN-1020 available from NIPPON KAYAKU Co., Ltd. as a crosslinker, 0.2 g of BSDM (bis(tert-butylsulfonyl)diazomethane) available from Wako Pure Chemical Industries Ltd. as a curing catalyst, and 0.1 g of tetrakis[methylene-(3,5-di-tert-butyl-4-hydroxyhydrocinnamate)]methane (trade name: Adekastab AO-60) as an antioxidant, and the solution was filtered through 0.2 μm of a membrane filter to obtain a resin solution (B-1).

Resin Synthesis Example 4

In a 5-L flask equipped with a stirrer, a thermometer, a nitrogen purge system, and a reflux condenser, 84.1 g of epoxy compound (M-2) was dissolved in 600 g of toluene. Then, 294.6 g of compound (M-3) and 25.5 g of compound (M-4) were added to the solution, and the resulting mixture was heated at 60° C. Thereafter, 1 g of carbon carried platinum catalyst (5% by mass) was added thereto, and after confirming that the internal reaction temperature was increased to 65 to 67° C., the mixture was further heated to 90° C., and aged for 3 hours. Then, the mixture was cooled to room temperature, and 600 g of methyl isobutyl ketone (MIBK) was added thereto. This reaction solution was filtered under pressure through a filter to remove the platinum catalyst. The solvent in the resin solution was distilled off under reduced pressure, and 270 g of propylene glycol monomethyl ether acetate (PGMEA) was added thereto to obtain a resin solution containing PGMEA as a solvent with a concentration of the solid component of 60% by mass. When the molecular weight of the resin in the resin solution was measured by GPC, the weight average molecular weight was 28,000 in terms of polystyrene. Further, to 100 g of the resin solution were added 9 g of a tetra-functional phenol compound, TEP-TPA (available from Asahi Organic Chemicals Industry Co., Ltd.), and 0.2 g of tetrahydrophthalic anhydride (available from New Japan Chemical Co., Ltd., RIKACID HH-A), and the solution was filtered through 0.2 μm of a membrane filter to obtain a resin solution (B-2).

(M-1)

(M-2)

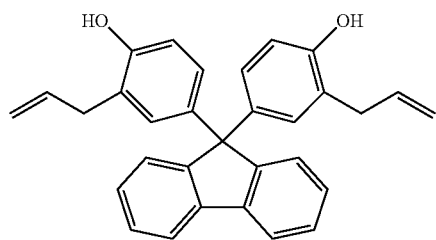

(M-3)

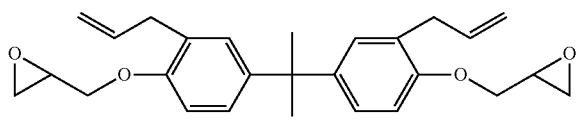

(M-4)

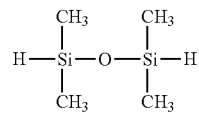

(M-5)

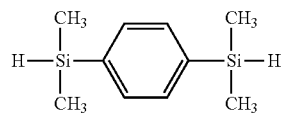

Examples 1 to 4 and Comparative Examples 1 to 4

Onto a 200-mm silicon wafer (thickness: 725 μm) whose entire surface was formed with copper posts having height of 10 μm and diameter of 40 μm, any one of resin solutions (A-1) to (A-4) was applied by spin coating, and then heated by a hot plate at 180° C. for 5 minutes to form a film corresponding to the layer (A) on the bump-formed surface of the wafer. On the other hand, a glass plate having a diameter of 200 mm (thickness: 500 μm) was used as a support, and onto the glass support was applied the polymer solution corresponding to the layer (B) by spin coating. Thereafter, the resultant was heated at 150° C. for 3 minutes on a hot plate to form the layer (B) having a film thickness shown in Table 1. The silicon wafer having the thermoplastic organopolysiloxane polymer layer (A) and the glass plate having the layer (B) thus obtained were bonded so that the respective resin surfaces faced each other, in a vacuum adhesion equipment under the conditions shown in Table 1, thereby preparing a laminate (pressure bonding conditions). The film thicknesses of the layer (A) and the layer (B) in the laminate (wafer processing laminate) are shown in Table 1. At this time, the film thicknesses of the layer (A) and the layer (B) were respectively measured by VM-1210 manufactured by Dainippon Screen Mfg. Co., Ltd., and F50-EXR manufactured by Filmetrics Inc.

Here, a glass plate was used as a support for the purpose of visually observing abnormalities after adhering the substrate, but a substrate such as a wafer, which does not transmit light, can be also used.

Thereafter, the bonded substrate was subjected to following tests, and the results of Examples and Comparative Examples were shown in Table 1. Also, evaluations were carried out by the order as mentioned below. When the result became anomaly (the judgment is "poor") during the tests, the evaluation thereafter was stopped, and showed with "-" in Table 1.

—Adhesiveness Test—

The wafer with a diameter of 200 mm was bonded by using a wafer bonding apparatus EVG520IS manufactured by EV group. The bonding was carried out at adhesion temperature shown in Table 1, under a chamber internal pressure during bonding of $10^{-3}$ mbar or less, with a load of 5 kN. After bonding, the substrate was once heated in an oven at 180° C. for 1 hour to cure the layer (B). After cooling to room temperature, the adhered state of the interface was visually observed. When no abnormalities like bubbles was found at the interface, the sample was evaluated as good, and shown with "good". When abnormalities were found, the sample was evaluated as poor, and shown with "poor".

—Back Surface Grinding Resistance Test—

The back surface of the silicon wafer was ground by a grinder (DAG810 manufactured by DISCO Co., Ltd.) using a diamond grinding wheel. After the wafer was ground to a final substrate thickness of 50 μm, abnormities such as crack and peeling were checked by an optical microscope (100-folds). When no abnormities was found, the sample was evaluated as good, and shown with "good", and when abnormities were found, the sample was evaluated as poor, and shown with "poor".

—Heat Resistance Test—

After the back surface of the silicon wafer had been ground, the laminate was placed in an oven under nitrogen atmosphere at 200° C. for 2 hours, followed by heating on a hot plate at 320° C. for 10 minutes. Then, abnormalities in appearance of the laminate was checked. When no appearance abnormalities was found, the sample was evaluated as good, and shown with "good", and when appearance abnormalities such as voids, blister of the wafer, and breakage of the wafer occur, the sample was evaluated as poor, and shown with "poor".

—Support Delaminatability Test—

Delaminatability of the support was evaluated in the following manner. First, a dicing tape was adhered onto the processed surface (non-circuit-forming surface) side of the wafer that had been thinned to 50 μm and subjected to the heat resistance test, by using a dicing frame. This dicing tape surface was set to a suction plate by vacuum suction. Then, one point of the glass was lifted by tweezers at room temperature to delaminate the glass substrate. When it could be delaminated without cracking the 50-μm wafer, the sample was evaluated as good, and shown with "good", and when abnormalities such as cracking occur, the sample was evaluated as poor, and shown with "poor".

—Cleaning Removability Test—

After the tape peeling delaminatability test, the 200-mm wafer (that had been exposed to the heat resistance test conditions) mounted on the dicing frame via the dicing tape was set on a spin coater, with the adhesive layer upside. Isononane was sprayed for 3 minutes as a cleaning solution, and then, rinsing was carried out by spraying isopropyl alcohol (IPA) while rotating the wafer. Thereafter, appearance of the wafer was observed, and the residue of the adhesive material resin was visually checked. When there was no residue of the resin, the sample was evaluated as good, and shown with "good", and when the residue was found, the sample was evaluated as poor, and shown with "poor".

—Peeling Force Test—

The polymer layer (A) was formed on the silicon wafer used as the support, then the polymer layer (B) was formed on the layer (A) and cured, under the same conditions as in Examples and Comparative Example. Thereafter, five polyimide tapes with a length of 150 mm and a width of 25 mm were adhered thereto, and a part of the layer (B) to which no tape has been adhered was removed. By using AUTO-GRAPH (AG-1) manufactured by Shimadzu Co., 120 mm of the tapes were peeled off from one end thereof by 180° peeling, and an average force applied to that time (120 mm stroke×5 times) was measured as a peeling force of the temporary adhesive layer.

TABLE 1

|  |  | Example 1 | Example 2 | Example 3 | Example 4 | Comparative Example 1 | Comparative Example 2 | Comparative Example 3 | Comparative Example 4 |
|---|---|---|---|---|---|---|---|---|---|
| Manufacturing conditions | Resin layer (A) | A-1 | A-2 | A-3 | A-2 | none | A-2 | A-4 | A-4 |
|  | Film thickness of layer (A) | 15 nm | 6 nm | 40 nm | 6 nm | — | 15 nm | 150 nm | 150 nm |
|  | Resin layer (B) | B-1 | B-2 | B-1 | B-2 | B-1 | none | B-1 | B-2 |
|  | Film thickness of layer (B) | 50 μm | 50 μm | 50 μm | 90 μm | 50 μm | — | 50 μm | 90 μm |
|  | Peeing force of layer (A) | 3 gf | 6 gf | 3 gf | 6 gf | — | — | 2 gf | 2 gf |
|  | Adhesion temperature | 150° C. | 120° C. | 150° C. | 120° C. | 150° C. | 150° C. | 150° C. | 120° C. |
| Results | Adhesiveness | good | good | good | good | good | poor | good | good |
|  | Back surface grinding resistance | good | good | good | good | good | — | good | good |
|  | Heat resistance | good | good | good | good | good | — | poor | poor |
|  | Support de-laminatability | good | good | good | good | poor | — | — | — |
|  | Cleaning Removability | good | good | good | good | — | — | — | — |

As shown in Table 1, it could be clarified that Examples 1 to 4, which satisfy the requirements of the present invention, facilitate temporary adhesion and delamination. Also, in Examples 1 to 4, problems such as void occurrence and breakage of the wafer do not occur even when the thinned wafer was subjected to the heat resistance test at a high temperature of 320° C. On the other hand, in Comparative Example 1, where the layer (A) was not formed in contrast with Example 1, the support could not be delaminated. Also, in Comparative Example 2, where the layer (B) was not formed, bonding could not be performed. Thus, it was revealed that lack of either of the two layers leads to failure of accomplishment of the processes. Further, in Comparative Examples 3 and 4, where the layer (A) is formed with a thickness of 100 nm or more, void occurrence was found at the heat resistance test at 320° C. Note that in Comparative Examples 3 and 4, the layer (A) has a thickness of 150 nm, as shown in Table 1. As described above, it could be clarified that when the layer (A) was formed with a thickness of less than 100 nm, the processes can be performed without error even in a high temperature state exceeding 300° C.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

The invention claimed is:

1. A wafer processing laminate comprising a support, a temporary adhesive material layer formed on the support, and a wafer laminated on the temporary adhesive material layer, the wafer having a circuit-forming front surface and a back surface to be processed, wherein
the temporary adhesive material layer comprises a complex temporary adhesive material layer having a two-layered structure that includes a first temporary adhesive layer composed of a thermoplastic organopolysiloxane polymer layer (A) having a film thickness of 80 nm or less and a second temporary adhesive layer composed of a thermosetting siloxane-modified polymer layer (B), the first temporary adhesive layer being releasably laminated to the front surface of the wafer, the second temporary adhesive layer being releasably laminated to the first temporary adhesive layer and the support.

2. The wafer processing laminate according to claim 1, wherein the film thickness of the first temporary adhesive layer is from 1 to 80 nm.

3. The wafer processing laminate according to claim 1, wherein the thermoplastic organopolysiloxane polymer layer (A) is an unreactive organopolysiloxane layer containing 99.000 to 99.999 mol % of a siloxane unit (D unit) represented by $R^{11}R^{12}SiO_{2/2}$, 1.000 to 0.001 mol % of a siloxane unit (M unit) represented by $R^{13}R^{14}R^{15}SiO_{1/2}$, and 0.000 to 0.500 mol % of a siloxane unit (T unit) represented by $R^{16}SiO_{3/2}$, where $R^{11}$, $R^{12}$, $R^{13}$, $R^{14}$, $R^{15}$ and $R^{16}$ each represent an unsubstituted or substituted monovalent hydrocarbon group, having a weight average molecular weight of 200,000 to 1,000,000, and containing 0.5% by mass or less of a low molecular weight component having a molecular weight of 740 or less.

4. The wafer processing laminate according to claim 2, wherein the thermoplastic organopolysiloxane polymer layer (A) is an unreactive organopolysiloxane layer containing 99.000 to 99.999 mol % of a siloxane unit (D unit) represented by $R^{11}R^{12}SiO_{212}$, 1.000 to 0.001 mol % of a siloxane unit (M unit) represented by $R^{13}R^{14}R^{15}SiO_{1/2}$, and 0.000 to 0.500 mol % of a siloxane unit (T unit) represented by $R^{16}SiO_{3/2}$, where $R^{11}$, $R^{12}$, $R^{13}$, $R^{14}$, $R^{15}$, and $R^{16}$ each represent an unsubstituted or substituted monovalent hydrocarbon group, having a weight average molecular weight of 200,000 to 1,000,000, and containing 0.5% by mass or less of a low molecular weight component having a molecular weight of 740 or less.

5. The wafer processing laminate according to claim 1, wherein the thermosetting siloxane-modified polymer layer (B) is a layer of a composition containing 100 parts by mass of a siloxane bond-containing polymer having a repeating unit represented by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

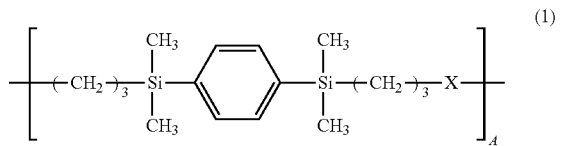

(1)

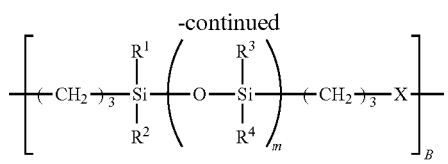

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (2),

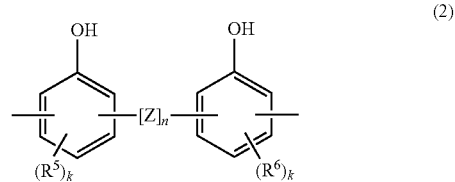

wherein Z represents a divalent organic group selected from any of

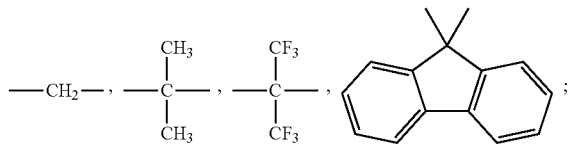

N represents 0 or 1; $R^5$ and $R^6$ each represent an alkyl or alkoxy group having 1 to 4 carbon atoms, and may be the same or different from each other; and "k" represents any of 0, 1, and 2.

6. The wafer processing laminate according to claim 1, wherein the thermosetting siloxane-modified polymer layer (B) is a layer of a composition containing 100 parts by mass of a siloxane bond-containing polymer having a repeating unit represented by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

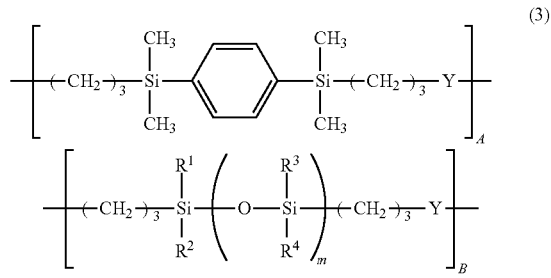

(3)

wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (4),

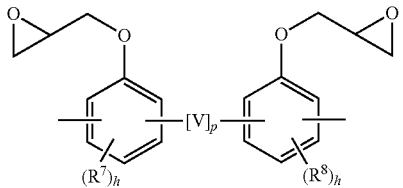

(4)

wherein V represents a divalent organic group selected from any of

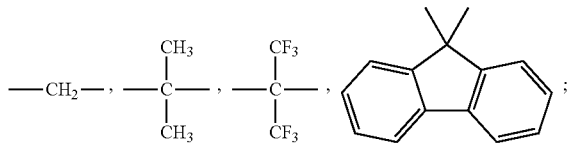

"p" represents 0 or 1; $R^7$ and $R^8$ each represent an alkyl or alkoxy group having 1 to 4 carbon atoms, and may be the same or different from each other; and "h" represents any of 0, 1, and 2.

7. The wafer processing laminate according to claim 1, wherein in a state that the thermosetting siloxane-modified polymer layer (B) is laminated to the thermoplastic organopolysiloxane polymer layer (A), the polymer layer (A) exhibits 1 to 50 gf of a peeing force when the polymer layer (B) is peeled from the polymer layer (A) after heat curing, wherein the peeling force is measured by 180° peeling using a test piece having a width of 25 mm.

8. A method for manufacturing a thin wafer comprising the steps of:
    (a) bonding a support to a circuit-forming front surface of a wafer that has the circuit-forming front surface and a non-circuit-forming back surface through a complex temporary adhesive material layer used for the wafer processing laminate according to claim 1, the complex temporary adhesive material layer including the thermoplastic organopolysiloxane polymer layer (A) and the thermosetting siloxane-modified polymer layer (B), wherein the bonding is performed by bonding the support formed with the thermosetting siloxane-modified polymer layer (B) to the circuit-attached wafer formed with the polymer layer (A) under vacuum;
    (b) heat curing the polymer layer (B);
    (c) grinding or polishing the non-circuit-forming back surface of the wafer bonded to the support;
    (d) processing the non-circuit-forming back surface of the wafer; and
    (e) delaminating the support and the thermosetting siloxane-modified polymer layer (B) laminated to the support together from the processed wafer.

9. A method for manufacturing a thin wafer comprising the steps of:
    (a) bonding a support to a circuit-forming front surface of a wafer that has the circuit-forming front surface and a non-circuit-forming back surface through a complex temporary adhesive material layer used for the wafer processing laminate according to claim 2, the complex temporary adhesive material layer including the thermoplastic organopolysiloxane polymer layer (A) and the thermosetting siloxane-modified polymer layer (B), wherein the bonding is performed by bonding the support formed with the thermosetting siloxane-modified polymer layer (B) to the circuit-attached wafer formed with the polymer layer (A) under vacuum;
    (b) heat curing the polymer layer (B);
    (c) grinding or polishing the non-circuit-forming back surface of the wafer bonded to the support;
    (d) processing the non-circuit-forming back surface of the wafer; and
    (e) delaminating the support and the thermosetting siloxane-modified polymer layer (B) laminated to the support together from the processed wafer.

10. A method for manufacturing a thin wafer comprising the steps of:
    (a) bonding a support to a circuit-forming front surface of a wafer that has the circuit-forming front surface and a non-circuit-forming back surface through a complex temporary adhesive material layer used for the wafer processing laminate according to claim 1, the complex temporary adhesive material layer including the thermoplastic organopolysiloxane polymer layer (A) and the thermosetting siloxane-modified polymer layer (B), wherein the bonding is performed by bonding the support to the circuit-attached wafer having the thermoplastic organopolysiloxane polymer layer (A) formed on the circuit-forming front surface and the thermosetting siloxane-modified polymer layer (B) formed on the polymer layer (A) under vacuum;
    (b) heat curing the polymer layer (B);
    (c) grinding or polishing the non-circuit-forming back surface of the wafer bonded to the support;
    (d) processing the non-circuit-forming back surface of the wafer; and
    (e) delaminating the support and the thermosetting siloxane-modified polymer layer (B) laminated to the support together from the processed wafer.

11. A method for manufacturing a thin wafer comprising the steps of:
    (a) bonding a support to a circuit-forming front surface of a wafer that has the circuit-forming front surface and a non-circuit-forming back surface through a complex temporary adhesive material layer used for the wafer processing laminate according to claim 2, the complex temporary adhesive material layer including the thermoplastic organopolysiloxane polymer layer (A) and the thermosetting siloxane-modified polymer layer (B), wherein the bonding is performed by bonding the support to the circuit-attached wafer having the thermoplastic organopolysiloxane polymer layer (A) formed on the circuit-forming front surface and the thermosetting siloxane-modified polymer layer (B) formed on the polymer layer (A) under vacuum;
    (b) heat curing the polymer layer (B);
    (c) grinding or polishing the non-circuit-forming back surface of the wafer bonded to the support;
    (d) processing the non-circuit-forming back surface of the wafer; and
    (e) delaminating the support and the thermosetting siloxane-modified polymer layer (B) laminated to the support together from the processed wafer.

12. A temporary adhesive material for a wafer processing, the temporary adhesive material being used for temporarily bonding a wafer having a circuit-forming front surface and a back surface to be processed to a support, comprising:

a complex temporary adhesive material layer having a two-layered structure that includes a first temporary adhesive layer composed of a thermoplastic organopolysiloxane polymer layer (A) having a film thickness of 80 nm or less and a second temporary adhesive layer composed of a thermosetting siloxane-modified polymer layer (B), wherein the first temporary adhesive layer is capable of being releasably laminated to the front surface of the wafer, and the second temporary adhesive layer is releasably laminated to the first temporary adhesive layer and is capable of being releasably laminated to the support.

13. The temporary adhesive material for a wafer processing according to claim 12, wherein the film thickness of the first temporary adhesive layer is from 1 to 80 nm.

14. The temporary adhesive material for a wafer processing according to claim 12, wherein the thermoplastic organopolysiloxane polymer layer (A) is an unreactive organopolysiloxane layer containing 99.000 to 99.999 mol % of a siloxane unit (D unit) represented by $R^{11}R^{12}SiO_{2/2}$, 1.000 to 0.001 mol % of a siloxane unit (M unit) represented by $R^{13}R^{14}R^{15}SiO_{1/2}$, and 0.000 to 0.500 mol % of a siloxane unit (T unit) represented by $R^{16}SiO_{3/2}$, where $R^{11}$, $R^{12}$, $R^{13}$, $R^{14}$, $R^{15}$, and $R^{16}$ each represent an unsubstituted or substituted monovalent hydrocarbon group, having a weight average molecular weight of 200,000 to 1,000,000, and containing 0.5% by mass or less of a low molecular weight component having a molecular weight of 740 or less.

15. The temporary adhesive material for a wafer processing according to claim 13, wherein the thermoplastic organopolysiloxane polymer layer (A) is an unreactive organopolysiloxane layer containing 99.000 to 99.999 mol % of a siloxane unit (D unit) represented by $R^{11}R^{12}SiO_{2/2}$, 1.000 to 0.001 mol % of a siloxane unit (M unit) represented by $R^{13}R^{14}R^{15}SiO_{1/2}$, and 0.000 to 0.500 mol % of a siloxane unit (T unit) represented by $R^{16}SiO_{3/2}$, where $R^{11}$, $R^{12}$, $R^{13}$, $R^{14}$, $R^{15}$, and $R^{16}$ each represent an unsubstituted or substituted monovalent hydrocarbon group, having a weight average molecular weight of 200,000 to 1,000,000, and containing 0.5% by mass or less of a low molecular weight component having a molecular weight of 740 or less.

16. The temporary adhesive material for a wafer processing according to claim 12, wherein the thermosetting siloxane-modified polymer layer (B) is a layer of a composition containing 100 parts by mass of a siloxane bond-containing polymer having a repeating unit represented by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

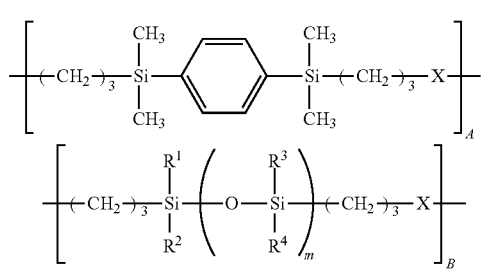

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group represented by the following general formula (2),

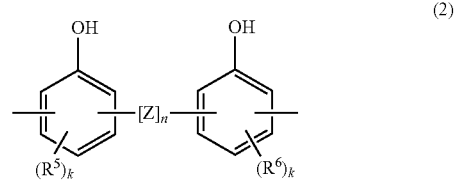

wherein Z represents a divalent organic group selected from any of

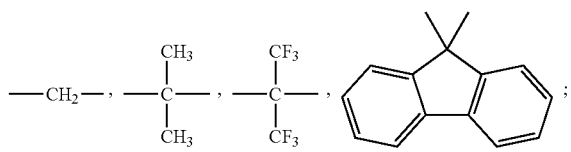

N represents 0 or 1; $R^5$ and $R^6$ each represent an alkyl or alkoxy group having 1 to 4 carbon atoms, and may be the same or different from each other; and "k" represents any of 0, 1, and 2.

17. The temporary adhesive material for a wafer processing according to claim 12, wherein the thermosetting siloxane-modified polymer layer (B) is a layer of a composition containing 100 parts by mass of a siloxane bond-containing polymer having a repeating unit represented by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

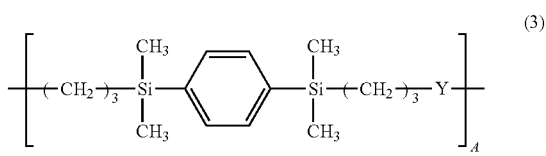

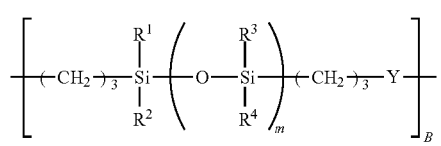

wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group represented by the following general formula (4),

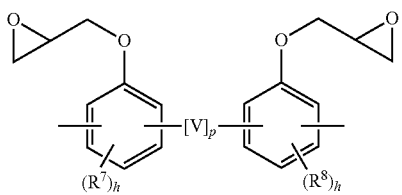

wherein V represents a divalent organic group selected from any of

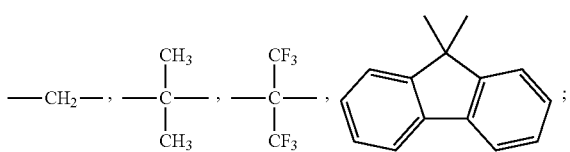

"p" represents 0 or 1; $R^7$ and $R^8$ each represent an alkyl or alkoxy group having 1 to 4 carbon atoms, and may be the same or different from each other; and "h" represents any of 0, 1, and 2.

18. The temporary adhesive material for a wafer processing according to claim 12, wherein in a state that the thermosetting siloxane-modified polymer layer (B) is laminated to the thermoplastic organopolysiloxane polymer layer (A), the polymer layer (A) exhibits 1 to 50 gf of a peeing force when the polymer layer (B) is peeled from the polymer layer (A) after heat curing, wherein the peeling force is measured by 180° peeling using a test piece having a width of 25 mm.

19. The temporary adhesive material for a wafer processing according to claim 12, wherein the film thickness of the first temporary adhesive layer is from 2 to 60 nm.

20. The temporary adhesive material for a wafer processing according to claim 12, wherein the temporary adhesive material for a wafer processing is used for a thermal process at a high temperature exceeding 300° C.

\* \* \* \* \*